(12) United States Patent
Li et al.

(10) Patent No.: US 11,370,967 B2
(45) Date of Patent: Jun. 28, 2022

(54) LIGHT EMITTING APPARATUS AND ELECTRONIC DEVICE COMPRISING LIGHT EMITTING APPARATUS

(71) Applicant: DOW GLOBAL TECHNOLOGIES LLC, Midland, MI (US)

(72) Inventors: Yang Li, Shanghai (CN); Xiuyan Wang, Shanghai (CN); Yan Huang, Shanghai (CN); Xiaofan Ren, Shanghai (CN); Bo Lv, Shanghai (CN)

(73) Assignee: DOW GLOBAL TECHNOLOGIES LLC, Midland, MI (US)

( * ) Notice: Subject to any disclaimer, the term of this patent is extended or adjusted under 35 U.S.C. 154(b) by 641 days.

(21) Appl. No.: 16/340,483

(22) PCT Filed: Oct. 14, 2016

(86) PCT No.: PCT/CN2016/102116
§ 371 (c)(1),
(2) Date: Apr. 9, 2019

(87) PCT Pub. No.: WO2018/068299
PCT Pub. Date: Apr. 19, 2018

(65) Prior Publication Data
US 2019/0241801 A1 Aug. 8, 2019

(51) Int. Cl.
*C09K 11/06* (2006.01)
*G02F 1/13357* (2006.01)
*H01L 51/00* (2006.01)

(52) U.S. Cl.
CPC ........ *C09K 11/06* (2013.01); *G02F 1/133617* (2013.01); *G02F 1/133621* (2013.01); *H01L 51/0067* (2013.01)

(58) Field of Classification Search
CPC .................................................. H01L 51/0067
See application file for complete search history.

(56) References Cited

U.S. PATENT DOCUMENTS

| | | | |
|---|---|---|---|
| 6,777,706 | B1 | 8/2004 | Tessler et al. |
| 7,248,310 | B2 | 7/2007 | Mueller-Mach et al. |
| 2007/0262302 | A1 | 11/2007 | Mochizuki et al. |
| 2012/0295098 | A1 | 11/2012 | Hwang et al. |
| 2012/0326180 | A1 | 12/2012 | Ohe et al. |
| 2014/0306869 | A1 | 10/2014 | Endo et al. |
| 2016/0049559 | A1 | 2/2016 | Li et al. |
| 2016/0223162 | A1 | 8/2016 | Shin et al. |
| 2016/0230960 | A1 | 8/2016 | Seo et al. |
| 2018/0006092 | A1 | 1/2018 | Rieger et al. |

FOREIGN PATENT DOCUMENTS

| | | |
|---|---|---|
| TW | 200410009 A | 6/2004 |
| WO | 2017210821 A1 | 12/2017 |

OTHER PUBLICATIONS

Supplementary European Search Report for Application No. 16918560, dated Mar. 10, 2020; Application Date: Oct. 14, 2016.
Notification of Reasons for Refusal for Japanese application No. 2019-518981; dated Oct. 14, 2016.
Search Report for Taiwan Patent application No. 106133218; dated Sep. 27, 2017.

*Primary Examiner* — Peter F Godenschwager
(74) *Attorney, Agent, or Firm* — G. Creston Campbell

(57) ABSTRACT

A light emitting apparatus affording high quality colors and energy economy and an electronic device comprising the light emitting apparatus.

18 Claims, 4 Drawing Sheets

10

11

12

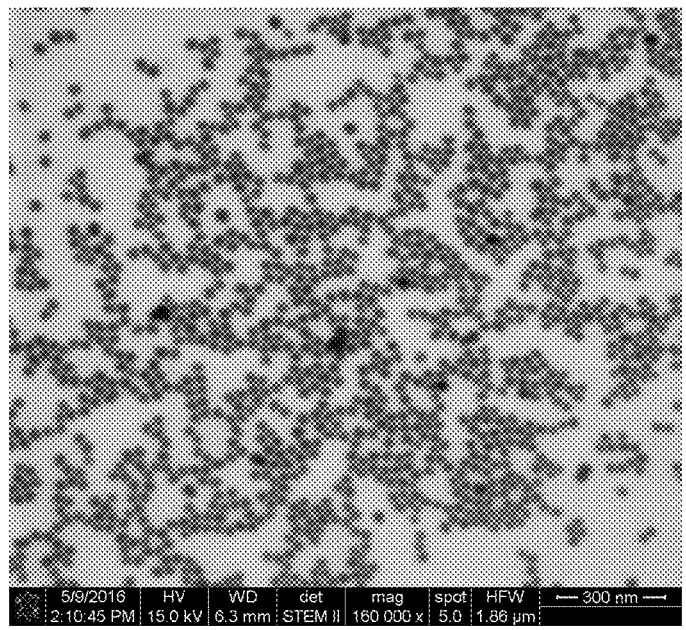
Figure 3. STEM image of surface-modified particles of Example 1
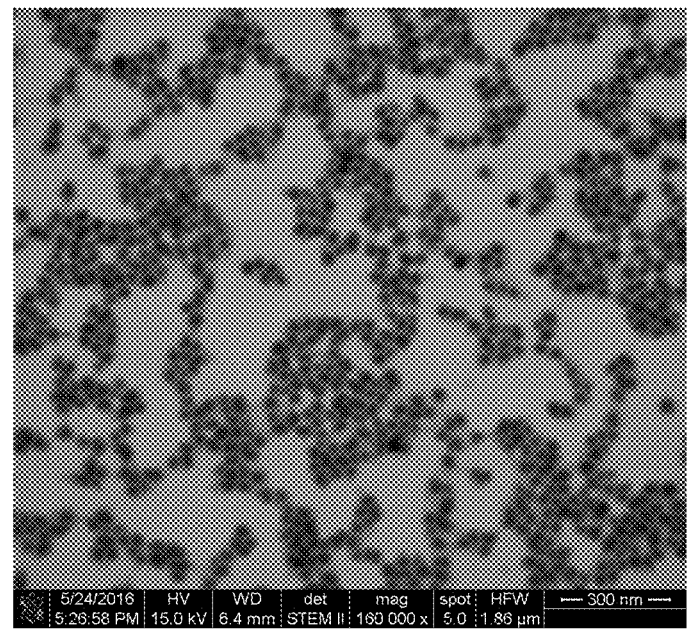
Figure 4. STEM image of surface-modified particles of Example 2

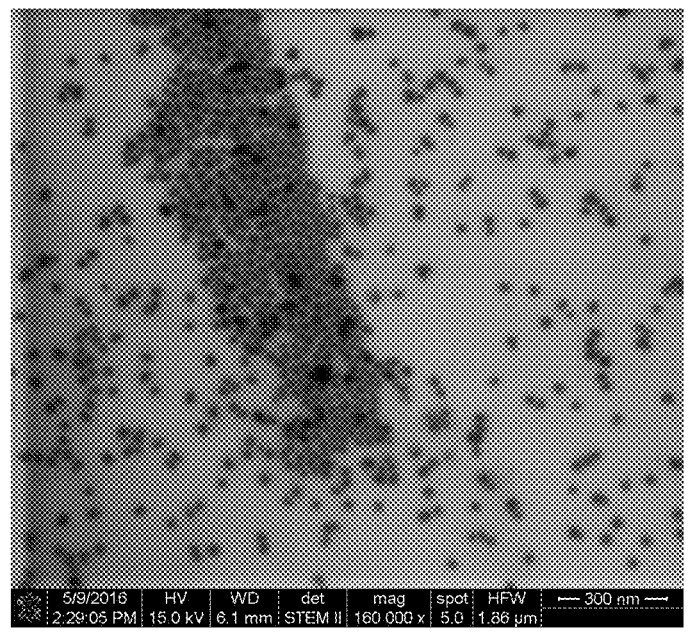
Figure 5. STEM image of surface-modified particles of Example 3

LIGHT EMITTING APPARATUS AND ELECTRONIC DEVICE COMPRISING LIGHT EMITTING APPARATUS

FIELD OF THE INVENTION

The present invention relates to a light emitting apparatus and an electronic device comprising the same.

INTRODUCTION

Conventional liquid crystal display (LCD) devices include an LCD unit and a backlight unit which uniformly illuminates the LCD unit with white light. A main factor that determines the maximum color performance of LCD devices is the spectral interaction between the light emitted from the backlight unit and the color filter array of the LCD unit. The color filter array consists of a mosaic of individually addressable pixels, each of which are made up of red (R), green (G) and blue (B) sub-pixels.

A major problem of conventional LCD devices is the large light loss associated with the LCD unit above the backlight source. Typically only less than 10% of light emitted from the backlight source is used and the remaining over 90% is absorbed by the LCD unit, including a polarizing filter, a thin film transistor (TFT) array, a liquid crystal cell, and a color filter array. In particular, transmittance through the RGB sub-pixel color filter is the lowest (about 30%), since each sub-pixel only allows one of the three primary colors to pass through.

Another problem of conventional LCD devices is the bichromatic white backlight made of blue light emitting diode (LED) chip with yttrium aluminum garnet (YAG) yellow phosphor coating. This bichromatic white backlight is not an ideal match with the spectral transmission of the RGB color filters, leading to unsatisfactory color quality of the display. To address this problem, new display technologies, such as RGB LEDs, wide color gamut phosphors, and quantum dot (QD) enhanced films, have recently been introduced to improve the color performance of LCD devices. However, there remains a need to provide a light emitting apparatus affording both high quality colors and energy economy.

SUMMARY OF THE INVENTION

The present invention provides a novel light emitting apparatus comprising a blue backlight unit and a color conversion array comprising at least red, green, and blue pixels. Surface-modified particles with narrow emission bandwidth (for example, a full width half maximum, or FWHM, of the emission band of less than 100 nanometers) are employed in the color conversion array to replace incumbent light absorbing materials in conventional color filter arrays. The surface-modified particles are excited by a uniform blue backlight which is modulated by a liquid crystal component. Surface-modified particles that absorb the blue light and generate green light may be located in the green pixel. Surface-modified particles that absorb the blue light and generate red light may be located in the red pixel. For the blue pixel area, light may directly come from the blue backlight unit. In one embodiment, this novel light emitting apparatus produces a high quality color via a combination of high purity R, G, and B colors. More importantly, such design could potentially lead to nearly 50% of power consumption reduction, relative to conventional color filter arrays.

In a first aspect, the present invention provides a light emitting apparatus comprising:

a backlight unit that emits visible blue light; and a color conversion array receiving the blue light from the backlight unit, wherein the color conversion array comprises a green color conversion layer and a red color conversion layer, wherein at least one of the green color conversion layer and the red color conversion layer comprises first or second surface-modified particles that emit green or red light respectively, and said first or second surface-modified particles comprise sol-gel nanoparticles and a plurality of luminophores attached to the surface of the sol-gel nanoparticles, where the luminophores have an absorption of at least 1000 $M^{-1}$ $cm^{-1}$ in a spectral region of 430-500 nanometers (nm) and exhibit a full width half maximum of the emission band of less than 100 nm; and wherein the color conversion array allows at least a portion of the blue light of the backlight unit to pass through so that at least red, green, and blue light are emitted by the light emitting apparatus to create colors comprising red, green, and blue components.

In a second aspect, the present invention provides an electronic device comprising the light emitting apparatus of the first aspect.

BRIEF DESCRIPTION OF THE DRAWINGS

FIG. 3 is a Scanning Transmission Electron Microscopy (STEM) image of surface-modified particles of Example 1.

FIG. 4 is a STEM image of surface-modified particles of Example 2.

FIG. 5 is a STEM image of surface-modified particles of Example 3.

DETAILED DESCRIPTION OF THE INVENTION

Figure 1A:
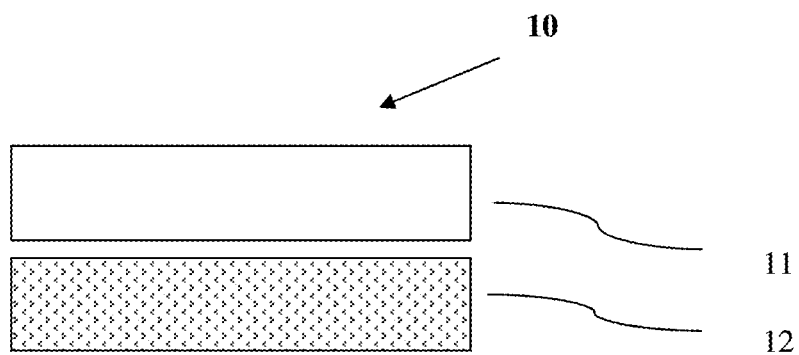
FIG. 1a, FIG. 1b, and FIG. 1c are each a schematic perspective view of one embodiment of a light emitting apparatus of the present invention.

A "luminophore" herein refers to a chemical unit in a chemical compound that is responsible for its luminescent properties when exposed to electromagnetic radiation. Luminophores may be referred to herein as light-emitting groups and vice versa.

"Sol-gel particles" herein refer to particles formed by a sol gel process involving conversion of monomers to form a colloid via hydrolysis and condensation reactions.

"Covalently bonded" herein refers to at least one chemical bond being formed between a sol-gel particle and a luminophore.

An "electronic device" herein refers to a device which applies the principles of electronics and uses the manipulation of electron flow for its operation.

An "alkyl" herein refers to an acyclic saturated monovalent hydrocarbon group and includes linear and branched groups with hydrogen unsubstituted or substituted by a halogen, a hydroxyl, a cyano, a sulfo, a nitro, an alkyl, a perfluoroalkyl, or combinations thereof.

A "heteroalkyl" herein refers to a saturated hydrocarbon group having a linear or branched structure wherein one or more of the carbon atoms within the alkyl group has been replaced with a heteroatom or a heterofunctional group containing at least one heteroatom. Heteroatoms may include, for example, O, N, P, S and the like. The hetero-functional group containing at least one heteroatom herein may include, for example, COOR', OCOOR', OR', NR'$_2$, PR'$_2$, P(=O)R'$_2$, or SiR'$_3$; where each R' is H, a substituted or unsubstituted C$_1$-C$_{30}$ hydrocarbyl group, or a substituted or unsubstituted C$_6$-C$_{30}$ aromatic group.

An "alkenyl" herein refers an unsaturated hydrocarbon that contains at least one carbon-carbon double bond. A substituted alkenyl refers to an alkenyl wherein at least one of the hydrogens on the carbon double bond is replaced by an atom or group other than H, for example, a C$_1$-C$_{30}$ alkyl group or C$_6$-C$_{30}$ aromatic group. An "alkynyl" refers to an unsaturated hydrocarbon containing at least one carbon-carbon triple bond. A substituted alkenyl refers to an alkenyl wherein at least one of the hydrogens on the carbon double bond is replaced by an atom or group other than H, for example, a C$_1$-C$_{30}$ alkyl group or C$_6$-C$_{30}$ aromatic group. In case that an alkenyl or alkynyl group contains more than one unsaturated bonds, these bonds usually are not cumulated, but may be arranged in an alternating order, such as in —[CH=CH-]$_p$, where p may be in the range of 2-50. Where not defined otherwise, preferred alkyl contains 1-22 carbon atoms; preferred alkenyl and alkynyl contain 2-22 carbon atoms.

An "alkoxy" herein refers to an alkyl group singular bonded with oxygen. Alkoxy such as C$_1$-C$_{24}$ alkoxy is a straight-chain or branched radical, for example, methoxy, ethoxy, isopropoxy, n-butoxy, sec-butoxy, tert-butoxy, heptyloxy, octyloxy, isooctyloxy, nonyloxy, decyloxy, undecyloxy, dodecyloxy, tetradecyloxy, hexadecyloxy, and octadecyloxy. A substituted alkoxy refers to a substituted alkyl group singular bonded with oxygen.

An "aliphatic cyclic group" herein refers to an organic group that is both aliphatic and cyclic. The aliphatic cyclic group contains one or more carbon rings that can be either saturated or unsaturated. A substituted aliphatic cyclic group may have one or more side chains attached where the side chain can be a substituted or unsubstituted alkyl, a substituted or unsubstituted heteroalkyl, a substituted or unsubstituted alkenyl, a substituted or unsubstituted alkynyl, or a substituted or unsubstituted alkoxy. Examples of aliphatic cyclic groups include cyclobutyl, cyclopentyl, cyclohexyl, methylcyclohexyl, dimethylcyclohexyl, trimethylcyclohexyl, 1-adamantyl, and 2-adamantyl.

A "heterocyclic group" herein refers to a cyclic compound that has atoms of at least two different elements as members of its ring(s). A heterocyclic group usually contains 5 to 7 ring members, among them, at least 1, especially 1-3, heteromoieties, usually selected from O, S, and NR'. Examples include C$_4$-C$_{18}$ cycloalkyl, which is interrupted by O, S, or NR', such as piperidyl, tetrahydrofuranyl, piperazinyl, and morpholinyl. Unsaturated variants may be derived from these structures, by abstraction of a hydrogen atom on adjacent ring members with formation of a double bond between them; an example for such a moiety is cyclohexenyl. A substituted heterocyclic group may have one or more side chains attached, where the side chain can be substituted or unsubstituted alkyl, substituted or unsubstituted heteroalkyl, substituted or unsubstituted alkenyl, substituted or unsubstituted alkynyl, substituted or unsubstituted alkoxy, or another heterocyclic group either directed linked together or via linking groups.

An "aromatic group" herein refers to a hydrocarbon with sigma bonds and delocalized pi electrons between carbon atoms forming rings, usually the benzene-based, or aryl groups.

Aryl is defined as an aromatic or polyaromatic substituent containing 1 to 4 aromatic rings (each ring containing 6 conjugated carbon atoms and no heteroatoms) that are optionally fused to each other or bonded to each other by carbon-carbon single bonds. A substituted aromatic or aryl group refers to an aryl ring with one or more substituents replacing the hydrogen atoms on the ring. The aryl group is unsubstituted or optionally and independently substituted by any synthetically accessible and chemically stable combination of substituents that are independently a halogen, a cyano, a sulfo, a carboxy, an alkyl, a perfluoroalkyl, an alkoxy, an alkylthio, an amino, a monoalkylamino, or a dialkylamino. Examples include substituted or unsubstituted derivatives of phenyl; biphenyl; o-, m-, or p-terphenyl; 1-naphthal; 2-naphthal; 1-, 2-, or 9-anthryl; 1-, 2-, 3-, 4-, or 9-phenanthrenyl and 1-, 2-, or 4-pyrenyl. Preferable aromatic or aryl groups are phenyl, substituted phenyl, naphthyl or substituted naphthyl.

A "heteroaromatic group" or a "heteroaryl group" herein refers to a 5- or 6-membered heteroaromatic ring that is optionally fused to an additional 6-membered aromatic ring(s), or is optionally fused to a 5- or 6-membered heteroaromatic rings. The heteroaromatic rings contain at least 1 and as many as 3 heteroatoms that are selected from the group consisting of O, S, and N. A substituted heteroaromatic or heteroaryl group refers to a heteroaromatic or heteroaryl ring with one or more substituents replacing the hydrogen atoms on the ring. The heteroaromatic or heteroaryl group is unsubstituted or optionally and independently substituted by any synthetically accessible and chemically stable combination of substituents that are independently a halogen, a cyano, a sulfo, a carboxy, an alkyl, a perfluoroalkyl, an alkoxy, an alkylthio, an amino, a monoalkylamino, or a dialkylamino. Examples include substituted or unsubstituted derivatives of 2- or 3-furanyl; 2- or 3-thienyl; N-, 2- or 3-pyrroyl; 2- or 3-benzofuranyl; 2- or 3-benzothienyl; N-, 2-, or 3-indolyl; 2-, 3-, or 4-pyridyl; 2-, 3-, or 4-quinolyl; 1-, 3-, or 4-isoquinlyl; 2-benzoxazolyl; 2-, 4-, or 5-(1,3-oxazolyl); 2-, 4-, or 5-(1,3-thiazolyl); 2-benzothiazolyl; 3-, 4-, or 5-isoxazolyl; N-, 2-, or 4-imidazolyl; N-, or 2-benimidazolyl; 1-, or 2-naphthofuranyl; 1-, or 2-naphthothieyl; N-, 2- or 3-benzindolyl; or 2-, 3-, or 4-benzoquinolyl.

An "excited state" herein is an electronic state of a molecule in which the electrons populate an energy state that is higher than another energy state for the molecule.

The light emitting apparatus of the present invention comprises a backlight unit that emits blue light for color conversion layers. A common source for the blue light is an LED lamp. Another blue light source is an organic light emitting device (OLED). These blue light sources must provide homogeneous blue light to the back surface of the color conversion layer. A common technique for providing such homogeneous blue light is to optically couple the light source to the edge of a clear plastic sheet often called light guide. The light guide can bend the light approximately normal to the top surface of the sheet so that light is emitted from the front surface of the light guide. A reflector may be placed behind the back surface of the light guide to improve brightness and uniformity. The light source can also be placed behind the display with diffusers to uniformly distribute the light across the displays. The wavelength of the blue light from the backlight unit may be from 430 nm to 500 nm, from 444 nm to 495 nm, or from 450 nm to 475 nm. The intensity of the blue light may be adjusted depending on the end application.

The light emitting apparatus of the present invention further comprises a color conversion array receiving the blue light from the backlight unit. The color conversion array useful in the present invention can allow at least a portion of the blue light of the backlight unit to pass through so that the red, green, and blue light are emitted by the light emitting apparatus to create colors comprising red, green, and blue components. For example, the color conversion array may allow up to 30%, up to 25%, up to 20%, up to 15%, up to 10%, or up to 5% of the blue light of the backlight unit to pass through.

The color conversion array useful in the present invention comprises a green color conversion layer and a red color conversion layer, where at least one of the green color conversion layer and the red color conversion layer comprises first or second surface-modified particles that emit green or red light, respectively. That is, the first or second surface-modified particles convert the blue light from the backlight unit to green or red colors respectively. In one embodiment, the color conversion array comprises a green color conversion layer comprising the first surface-modified particles that convert the blue light from the backlight unit to green light, and a red color conversion layer comprising organic red light emitting compounds, inorganic phosphors, quantum dots, or mixtures thereof. In another embodiment, the color conversion array comprises a red color conversion layer comprising the second surface-modified particles that convert the blue light from the backlight unit to red light, and a green color conversion layer comprising organic green light emitting compounds, inorganic phosphors, quantum dots, or mixtures thereof. In a further embodiment, the color conversion array comprises a green color conversion layer comprising the first surface-modified particles that convert the blue light from the backlight unit to green light, and a red color conversion layer comprising the second surface-modified particles that convert the blue light from the backlight unit to red light. In one embodiment, the color conversion array allows at least a portion of the blue light of the backlight unit to pass through so that the red, green, and blue light are emitted by the light emitting apparatus to create colors with red, green, and blue components.

The first and second surface-modified particles useful in the color conversion array can each independently exhibit a full width half maximum (FWHM) of the emission band of less than 100 nm, less than 90 nm, less than 70 nm, or even less than 50 nm; and have an absorption of at least 1000 $M^{-1}$ $cm^{-1}$ in a spectral region of 430-500 nm. The first and second surface-modified particles may be spherical. The first and second surface-modified particles may each independently have a polydispersity index less than 0.7, less than 0.5, or even less than 0.2, as measured by dynamic light scattering. The first and second surface-modified particles preferably independently have a unimodal distribution.

The first and second surface-modified particles useful in the color conversion array may each independently comprise sol-gel nanoparticles and a plurality of luminophores attached to the surface of the sol-gel nanoparticles. The luminophores may exhibit a FWHM of the emission band of less than 100 nm and has an absorption of at least 1000 $M^{-1}$ $cm^{-1}$ in a spectral region of 430-500 nm. Preferably, the luminophores exhibit a FWHM of the emission band of less than 90 nm, less than 70 nm, or even less than 50 nm. The first and second surface-modified particles may comprise two or more types of luminophores attached to the surface of the sol-gel particles to achieve a desirable output of spectral emission colors.

The luminophores in the first or second surface modified particles can be further classified as singlet luminophores (fluorophores) or triplet luminophores (phosphor), depending on the nature of the excited state responsible for the emission of photons. On the other hand, some luminophores can't be classified as exclusively singlet luminophores or triplet luminophores. Most fluorophores consist of conjugated pi systems. A typical luminophore is an aromatic or heteroaromatic compound such as a pyrene, an anthracene, an acridine, a stilbene, an indole or benzoindole, a porphyrin, a perylene, a cyanine, a coumarin, naphthalimide, rhodamine, fluoresceine, xanthenes, benzoxanthene, diketopyrrolopyrrole, and the like.

The luminophores in the first and second surface modified particles independently derive from organic light emitting compounds (that is, "luminophore-containing compounds"), for example, the luminophore can be a chemical unit or moiety obtained through a reaction of the organic light emitting compound after forming a covalent bond with a hydrolyzable silane precursor. The luminophores in the first and second surface-modified particles may be independently covalently bonded, directly or indirectly, with sol-gel nanoparticles, for example, via bonds such as —Si—O—Si—, —Al—O—Si—, —Ti—O—Si—, —Zr—O—Si—, —Al—O—Al—, or combinations thereof. Preferably, the luminophores in the first and second surface-modified particles, respectively, are covalently bonded, directly or indirectly, with the sol-gel nanoparticles via —Si—O—Si— bonds.

The organic light emitting compounds useful in the present invention may include organic and metal-organic complex light emitting compounds. Examples of metal-organic complex light emitting compounds include transition metal complexes, such as tris(2-phenylpyridinyl) iridium. The organic light emitting compounds may have substantially the same luminescent properties as the luminophores described above, e.g., the FWHM of the emission band and the absorption in a spectral region of 430-500 nm.

The luminophores in the first surface-modified particles may derive from organic light emitting compounds having the structure of formula (I):

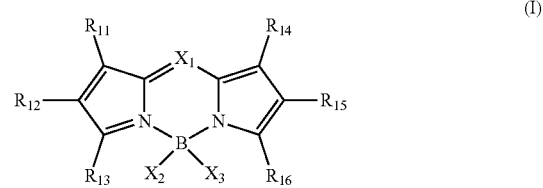

wherein $R_{11}$ through $R_{16}$ are each independently selected from the group consisting of H, a halogen, —CN, —CF$_3$, —NO$_2$, a substituted or unsubstituted $C_1$-$C_{24}$ alkyl, a substituted or unsubstituted $C_2$-$C_{24}$ alkenyl, a substituted or unsubstituted $C_2$-$C_{24}$ alkynyl, a substituted or unsubstituted $C_1$-$C_{24}$ alkoxy, a substituted or unsubstituted $C_3$-$C_{20}$ cyclic or heterocyclic group, —SO$_3$H, sulfonate, —SO$_2$O—, a thio ether, an ether, a urea, —CO$_2$H, an ester, an amide, an amine, a substituted or unsubstituted $C_6$-$C_{20}$ aromatic group, and a substituted or unsubstituted $C_5$-$C_{20}$ heteroaromatic group; $R_{11}$ through $R_{12}$ may join together to form a 5-, 6-, 7-membered ring together with the atoms they are bonded; $R_{12}$ through $R_{13}$ may join together to form a 5-, 6-, 7-membered ring together with the atoms they are bonded; $R_{14}$ through $R_{15}$ may join together to form a 5-, 6-, 7-membered ring together with the atoms they are bonded; and $R_{15}$ through $R_{16}$ may join together to form a 5-, 6-, 7-membered ring together with the atoms they are bonded, that may be substituted or unsubstituted;

wherein $X_1$ is N or $CR_{17}$, wherein $R_{17}$ is selected from the group consisting of H, a halogen, —CN, —CF$_3$, a substituted or unsubstituted $C_1$-$C_{24}$ alkyl, a substituted or unsubstituted $C_2$-$C_{24}$ alkenyl, a substituted or unsubstituted $C_2$-$C_{24}$ alkynyl, a substituted or unsubstituted $C_1$-$C_{24}$ alkoxy, a substituted or unsubstituted $C_3$-$C_{20}$ cyclic or heterocyclic group, a substituted or unsubstituted $C_6$-$C_{20}$ aromatic group, a substituted or unsubstituted $C_5$-$C_{20}$ heteroaromatic group, an ether, an ester, a carboxylic acid, —OH, an amide, an amine, and a sulfide; and wherein $X_2$ and $X_3$ are each independently selected from the group consisting of a halogen, a substituted or unsubstituted $C_1$-$C_{24}$ alkyl, a substituted or unsubstituted $C_2$-$C_{24}$ alkenyl, a substituted or unsubstituted $C_2$-$C_{24}$ alkyne, a substituted or unsubstituted $C_3$-$C_{20}$ cyclic or heterocyclic group, a $C_6$-$C_{20}$ substituted or unsubstituted aromatic group, a substituted or unsubstituted $C_5$-$C_{20}$ heteroaromatic group, and a substituted or unsubstituted $C_1$-$C_{24}$ alkoxy; and $X_2$ and $X_3$ may join together to form a single substituent group.

Preferably, $R_{11}$ through $R_{16}$ in formula (I) are each independently selected from H, —CN, —COOH, —OH, a halogen, methyl, ethyl, propyl isopropyl, perfluoromethyl, phenyl, a substituted phenyl, naphthyl, a substituted naphthyl, methoxy, ethoxy, styryl, pyridyl, substituted pyridyl, thienyl, a substituted thienyl, pyrrolyl, a substituted pyrrolyl, ester, sulfonate, nitro, amine, an amide, or combinations thereof.

Preferably, $R_{12}$ through $R_{15}$ in formula (I) are each independently electron-withdrawing groups selected from trihalides, amides, esters, ammoniums, quaternary amines, quanternary ammonium bases, sulfonates, —SO$_3$H, —CN, or —NO$_2$. More preferably, $R_{12}$ through $R_{15}$ in formula (I) are each independently selected from the group consisting of —CN, —NO$_2$, esters, amides, trifluoromethyl, and sulfonates.

Preferably, $X_1$ in formula (I) is $CR_{17}$, wherein $R_{17}$ is H, —CN, methyl, ethyl, phenyl, a substituted phenyl, naphthyl, a substituted naphthyl, a substituted or unsubstituted $C_1$-$C_3$ alkyl, a substituted or unsubstituted $C_1$-$C_4$ alkenyl, thiol, a hetercyclic group, and a heteroaromatic group. More preferably, $R_{17}$ is methyl. Also preferably, $R_{17}$ is a substituted or unsubstituted $C_6$-$C_{10}$ aromatic group, for example, phenyl or a substituted phenyl.

$X_2$ and $X_3$ in formula (I) can be each independently selected from the group consisting of F, methyl, ethyl, n-propyl, iso-propyl, n-butyl, adamantyl, a substituted or unsubstituted phenyl, a $C_1$-$C_6$ alkyoxy such as methoxy, a substituted or unsubstituted ethynyl such as ethynyltoluene, ethynylpyrene, and ethynylphenyl. Preferably, $X_2$ and $X_3$ are each F.

In one embodiment, the luminophores in the first surface-modified particles derive from organic light emitting compounds having the structure of formula (II):

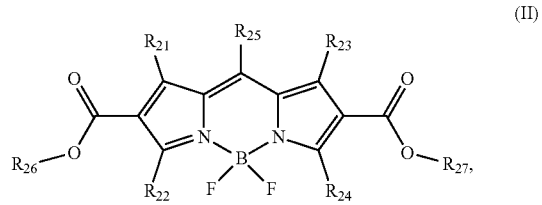

wherein $R_{21}$ through $R_{25}$ are each independently selected from the group consisting of H, a halogen, —CN, —CF$_3$, —NO$_2$, a substituted or unsubstituted $C_1$-$C_{24}$ alkyl, a substituted or unsubstituted $C_2$-$C_{24}$ alkenyl, a substituted or unsubstituted $C_2$-$C_{24}$ alkynyl, a substituted or unsubstituted $C_1$-$C_{24}$ alkoxy, a substituted or unsubstituted $C_3$-$C_{20}$ cyclic or heterocyclic group, —SO$_3$H, sulfonate, —SO$_2$O—, a thio ether, an ether, a urea, —CO$_2$H, an ester, an amide, an amine, a substituted or unsubstituted $C_6$-$C_{20}$ aromatic group, and a substituted or unsubstituted $C_5$-$C_{20}$ heteroaromatic group; and $R_{26}$ and $R_{27}$ are each independently selected from the group consisting of a substituted or unsubstituted $C_1$-$C_{20}$ alkyl, a $C_2$-$C_{20}$ substituted or unsubstituted alkenyl, a substituted or unsubstituted $C_2$-$C_{24}$ alkynyl, a substituted or unsubstituted $C_1$-$C_{24}$ alkoxy, a substituted or unsubstituted $C_6$-$C_{24}$ aryl group; a substituted or unsubstituted $C_3$-$C_{20}$ cyclic or heterocyclic group, and a substituted or unsubstituted $C_5$-$C_{20}$ heteroaromatic group.

The substituted or unsubstituted $C_1$-$C_{24}$ alkyl in formula (I) or (II) above may include a substituted or unsubstituted $C_1$-$C_{22}$, $C_1$-$C_{16}$, $C_1$-$C_{12}$, or $C_1$-$C_5$ alkyl. Examples of alkyls include methyl, ethyl, propyl, iso-propyl, butyl, iso-butyl, tert-butyl pentyl, hexyl, heptyl, octyl, or combinations thereof.

The substituted or unsubstituted $C_2$-$C_{24}$ alkenyl in formula (I) or (II) above may include a $C_2$-$C_{22}$, $C_2$-$C_{16}$, $C_2$-$C_{12}$, or $C_2$-$C_5$ substituted or unsubstituted alkenyl. Examples of substituted or unsubstituted alkenyls include ethylene; n-propylene; i-propylene; n-, i-, sec, tert-butylene; n-pentylene; n-hexylene; n-heptylene; n-octylene; or combinations thereof.

The substituted or unsubstituted $C_2$-$C_{24}$ alkynyl in formula (I) or (II) above may include a substituted or unsubstituted $C_2$-$C_{20}$, $C_2$-$C_{16}$, $C_2$-$C_5$, or $C_2$-$C_3$ alkynyl. Examples of substituted or unsubstituted alkynyl include ethynyl, propynyl, phenylethylnyl, or combinations thereof.

The substituted or unsubstituted $C_1$-$C_{24}$ alkoxy in formula (I) or (II) above may include a substituted or unsubstituted $C_1$-$C_{20}$, $C_1$-$C_{16}$, $C_1$-$C_{12}$, or $C_1$-$C_5$ alkoxy. Examples of substituted or unsubstituted alkoxys include methoxy; ethoxy; n-, i-propoxy; n-, i-, sec-, tert-butoxy; n-penyoxy; n-hexoxy; n-heptoxy; n-octoxy; or combinations thereof.

The substituted or unsubstituted $C_3$-$C_{20}$ cyclic or heterocyclic group in formula (I) or (II) above may include a substituted or unsubstituted $C_3$-$C_{18}$, $C_6$-$C_{14}$, or $C_6$-$C_8$ cyclic or heterocyclic group. Examples of substituted or unsubstituted cyclic or heterocyclic groups include cyclopropyl, cyclobutyl, cyclopentyl, methylcyclopentyl, cyclohexyl, methylcyclohexyl, dimethylcyclohexyl, cycloheptyl, cyclooctyl, cyclononyl, cyclodecyl, 1-adamantyl, 2-adamantyl, piperdyl, tetrahydrofuran, piperazinyl, morpholinyl, cyclopentyloxy, cyclohexyloxy, cycloheptyloxy, cyclooctyloxy or mixtures thereof. Unsaturated variants may be derived from these structures by substraction of a hydrogen atom on 2 adjacent ring members with formation of a double bond between them, an example for such a moiety is cyclohexenyl.

The substituted or unsubstituted $C_6$-$C_{30}$ aromatic group in formula (I) or (II) above may include a substituted or unsubstituted $C_6$-$C_{20}$, $C_6$-$C_{18}$, $C_6$-$C_{14}$, or $C_6$-$C_{10}$ aromatic group. Examples include phenyl; biphenyl; o-, m-, or p-terphnyl; 1-naphthyl; 2-naphthyl; 1-, 2-, or 9-anthryl; 1, 2, 3, 4, or 9-phenanthrenyl; 1, 2, or 4-pyrenyl; or combinations thereof.

The substituted or unsubstituted $C_5$-$C_{30}$ heteroaromatic group in formula (I) or (II) above may include a substituted or unsubstituted $C_5$-$C_{20}$, $C_5$-$C_{16}$, $C_5$-$C_{12}$, or $C_5$-$C_8$ heteroaromatic group. Examples include 2- or 3-furanyl; 2- or 3-thienyl; N-, 2- or 3-pyrroyl; 2- or 3-benzofuranyl; 2- or 3-benzothienyl; N-, 2-, or 3-indolyl; 2-, 3-, or 4-pyridyl; 2-, 3-, or 4-quinolyl; 1-, 3-, or 4-isoquinlyl; 2-benzoxazolyl; 2-, 4-, or 5-(1,3-oxazolyl); 2-, 4-, or 5-(1,3-thiazolyl); 2-benzothiazolyl; 3-, 4-, or 5-isoxazolyl; N-, 2-, or 4-imidazolyl; N-, or 2-benimidazolyl; 1-, or 2-naphthofuranyl;1-, or 2-naphthothieyl; N-, 2- or 3-benzindolyl; 2-, 3-, or 4-benzoquinolyl; or combinations thereof.

The luminophores in the first surface-modified particles may derive from organic light emitting compounds including, for example,

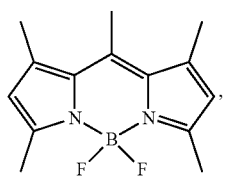

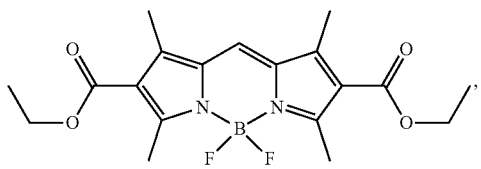

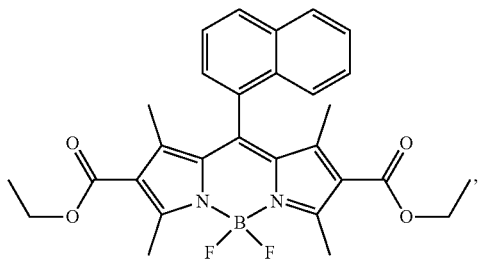

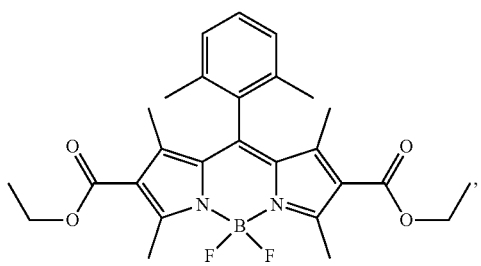

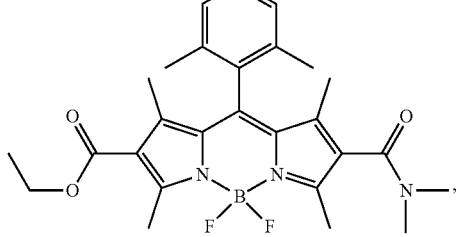

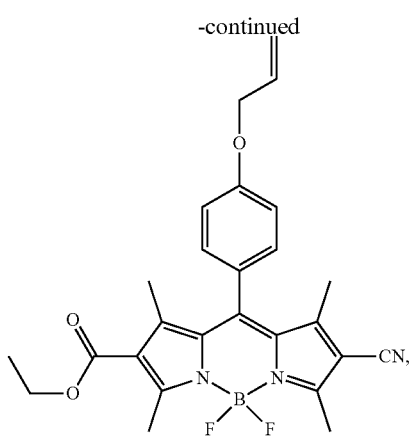

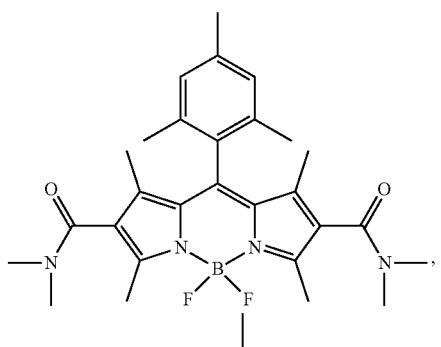

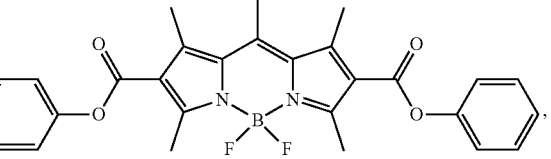

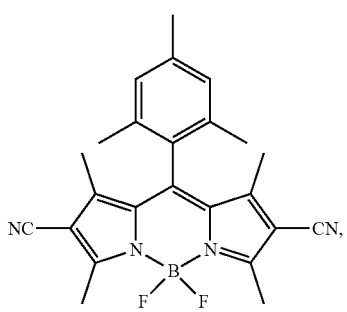

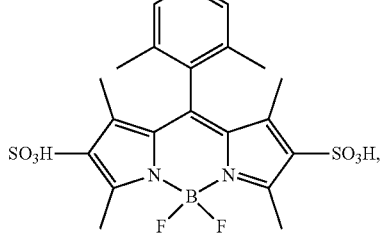

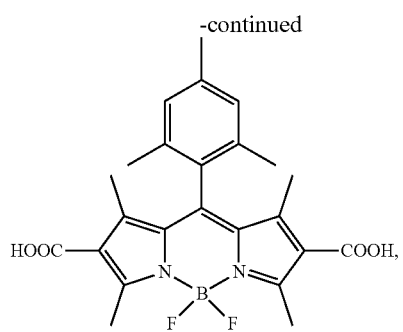

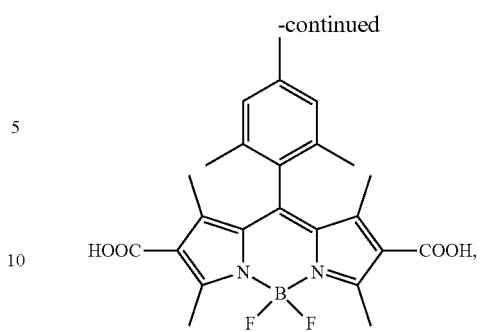

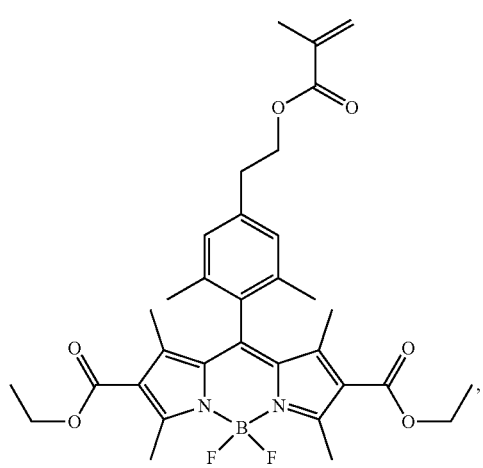

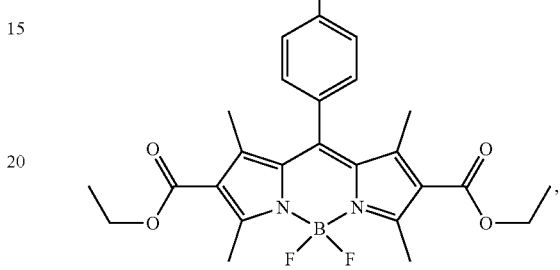

or mixtures thereof.

The luminophores in the second surface-modified particles may derive from organic light emitting compounds selected from perylenediimide, boron-dipyrromethene, diketopyrrolopyrrol, 4-dicyanomethylene-2-t-butyl-6-1,1,7,7-tetramethyljulolidyl-9-enyl-4H-pyran, coumarin, rhodamine, fluorescein, cyanine, or mixtures thereof. Specific examples of suitable organic light emitting compounds include,

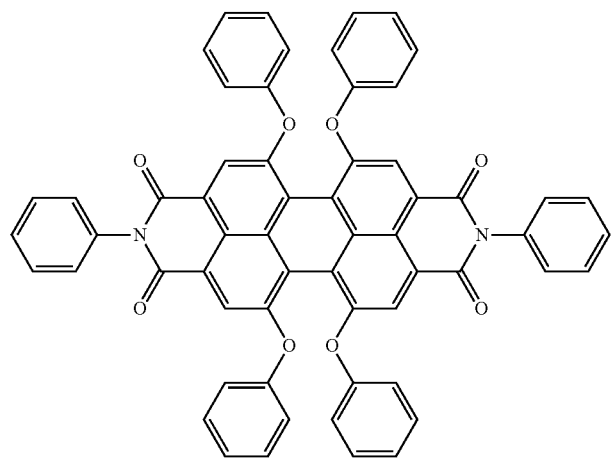

-continued

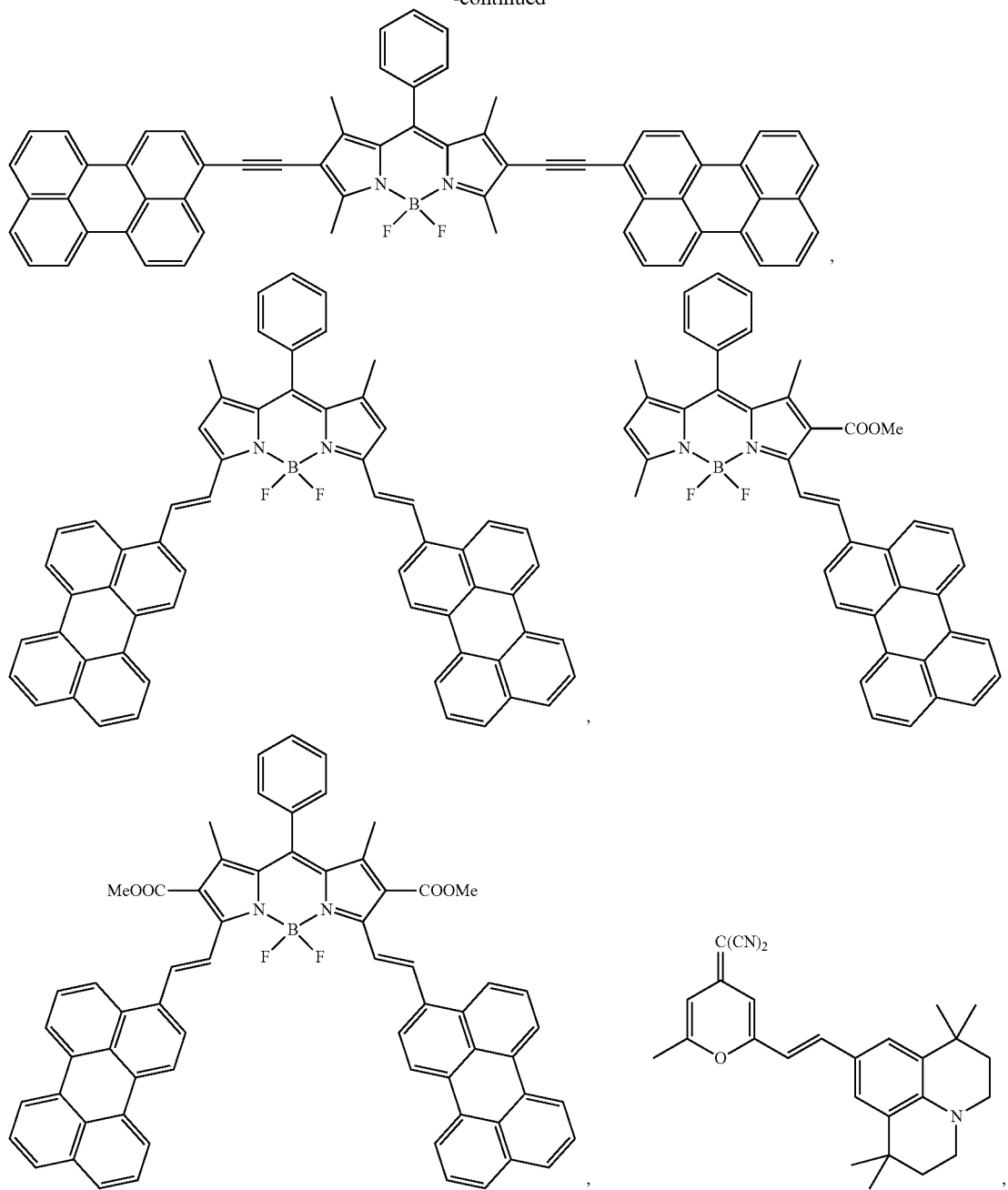

or mixtures thereof.

The sol-gel nanoparticles in the first and second surface-modified particles may be independently selected from silica, alumina, zirconia, titania, or mixtures thereof. The sol-gel nanoparticles in the first and second surface-modified particles may independently have a particle size, that is, the diameter of the sol-gel nanoparticles, in the range of from 10 to 2,000 nm, from 20 to 200 nm, or from 30 to 100 nm. The particle size may be measured using a scanning transmission electron microscopy.

The first and second surface-modified particles useful in the color conversion array may be each independently obtained by reacting one or more types of hydroxy-functional sol-gel nanoparticles with one or more silane-functional light emitting compounds having the structure of formula (III): D-L-SiX$_3$ through a sol gel process, and optionally one or more organic silane compounds in order to achieve a desirable output of spectral emission colors. "Hydroxy-functional" herein refers to one or more hydroxyl groups present on the surface of the hydroxyl-functional sol-gel nanoparticles. In one embodiment, the first and second surface-modified particles useful in the color conversion array are each independently obtained by:

(i) providing the hydroxy-functional sol-gel nanoparticles; and (ii) reacting the hydroxy-functional sol-gel nanoparticles from step (i) with a silane-functional light emitting compound having the structure of formula (III) via the hydroxyl group, $$D\text{-}L\text{-}SiX_3 \qquad (III),$$

wherein D is the luminophore described above, L is a direct bond or an organic group, and X is a hydrolyzable substituent. A mixture of two or more types of such compounds may be used. L in formula (III) can comprise a divalent, a trivalent, a tetravalent or a pentavalent moiety. For example, L can be a substituted or unsubstituted alkyl, such as a substituted or unsubstituted $C_1$-$C_{12}$, $C_1$-$C_8$, or $C_1$-$C_4$ alkyl; a substituted or unsubstituted alkoxy, such as a substituted or unsubstituted $C_1$-$C_{12}$, $C_1$-$C_8$, or $C_1$-$C_4$ alkoxy; a substituted or unsubstituted alkenyl group, such as a substituted or unsubstituted $C_2$-$C_{12}$, $C_2$-$C_8$, or $C_2$-$C_4$ alkenyl group; a substituted or unsubstituted alkynyl group, such as a substituted or unsubstituted $C_2$-$C_{12}$, $C_2$-$C_8$, or $C_2$-$C_4$ alkynyl group; a substituted or unsubstituted aliphatic cyclic group, such as a substituted or unsubstituted $C_3$-$C_{20}$, $C_5$-$C_{10}$, or $C_5$-$C_6$ aliphatic cyclic group; a substituted or unsubstituted heterocyclic group, such as a substituted or unsubstituted $C_3$-$C_{20}$, $C_5$-$C_{10}$, or $C_5$-$C_6$ heterocyclic group; a substituted or unsubstituted aromatic group, such as a substituted or unsubstituted $C_6$-$C_{20}$, $C_6$-$C_{14}$, or $C_6$-$C_{10}$ aromatic group; a substituted or unsubstituted heteroaromatic group, such as a substituted or unsubstituted $C_5$-$C_{20}$, $C_5$-$C_{14}$, or $C_5$-$C_6$ heteroaromatic group; an ether, an ester, a urethane, a sulfide, an amide, or an amine. Preferably, L is a $C_1$-$C_8$ substituted or unsubstituted alkyl or a $C_1$-$C_{10}$ substituted or unsubstituted alkoxy.

X in formula (III) is a hydrolyzable substituent. A hydrolyzable substituent or compound in the present invention refers to a functional group or a compound which undergoes breakage of chemical bond by the addition of water, optionally in the presence of a catalyst. Examples of suitable X groups include a substituted or unsubstituted $C_1$-$C_{18}$ alkoxy, and preferably a substituted or unsubstituted $C_1$-$C_4$ alkoxy. More preferably, X is methoxy, ethoxy, or 2-methoxy-ethoxy. X can also be —OH group.

The silane-functional light emitting compound useful in preparing the first and second surface-modified particles may be prepared by known processes, in which the light emitting compound described above is first attached with one or more than one reactive group such as an allyl group, an epoxy group, an amine group, a carboxylic acid, or combinations thereof, forming a reactive light emitting compound which then reacts with a hydrolyzable silane precursor to form the silane-functional light emitting compound, D-L-SiX$_3$. The hydrolyzable silane precursor useful in forming the silane-functional light emitting compound contains at least one functional group which can react with the reactive group of the reactive light emitting compound to form a covalent bond, for example, —Si—C—. The hydrolyzable silane precursor may have the general formula $R_{(4-n)}SiX_n$, where X is a hydrolyzable substituent as described above in formula (III), such as ethoxy, methoxy, or 2-methoxy-ethoxy; R can be H, a monovalent organic group having from 1 to 12 carbon atoms and containing a functional organic group such as, for example, mercapto, epoxy, acrylyl, methacrylyl, and amino; and n is an integer of from 1 to 4, preferably an integer of from 2 to 4. In one embodiment, the hydrolyzable silane precursor useful in forming the silane-functional light emitting compound is HSi(OEt)$_3$.

In another embodiment, step (ii) of preparing the first and second surface-modified particles comprises reacting the hydroxy-functional sol-gel nanoparticles with a mixture comprising: (a) the silane-functional light emitting compound, and (b) an organic silane compound having the structure of SiX$^1_4$, and optionally (c) an organic metal compound of MX$^1_4$ or MX$^1_3$ or mixtures thereof, wherein each X$^1$ is the same or different and independently a hydrolyzable substituent, and M is selected from Al, Zr, Ti, or combinations thereof. X$^1$ may include those groups described above for X in formula (III), and preferably X$^1$ is a $C_1$-$C_{18}$ alkoxy. Examples of suitable organic silane compounds include substituted or unsubstituted tetra-$C_1$-$C_8$ alkoxysilanes such as tetramethoxysilane (TMOS), tetraethoxysilane (TEOS), tetra-n-propoxysilane, and tetra-n-butoxysilane; tetrakis(methoxyethoxy)silane; tetrakis(ethoxyethoxy)silane; tetrakis(methoxyethoxyethoxy) silane; tetrakis(methoxypropoxy)silane; tetrakis(2-methyl-hexoxy)silane; di-$C_1$-$C_4$ alkyl-tetra-$C_1$-$C_8$ alkoxydisilanes such as dimethyltetraethoxydisiloxane; tetra-$C_1$-$C_4$ acyloxysilanes such as tetraacetoxysilane; tetra-$C_2$-$C_4$ alkenyloxysilanes such as tetraallyloxysilane; or mixtures thereof. The organic silane compound is preferably TEOS, TMOS, or a mixture thereof.

In preparing the first and second surface-modified particles, the organic metal compound, if used, can form Al$_2$O$_3$, ZrO$_2$, or TiO$_2$. Examples of suitable organic metal compounds include tri-$C_1$-$C_4$ alkoxy aluminate like tri-n-, -i-propoxy aluminate, tri-n-butoxyaluminate, like di-$C_1$-$C_4$ alkoxy aluminoxy tri-$C_1$-$C_4$ alkoxy silanes such as dibutoxy-aluminoxy-triethoxy-silane; tetra-n-butoxy zirconate, tetraethoxy zirconate, and tetra-n-, -i-propoxy zirconate; tetra-$C_1$-$C_4$ alkoxy zirconate such as tetra-n-butyl titanate, tetraethoxy titanate, tetramethoxy titanate, and tetra-n-, -i-propoxy titanate; or mixtures thereof. Preferably, an organic zirconia, ZrX$^2_4$, such as zirconium n-butoxide is used as the organic metal compound. Also preferably, an organic titanium compound, TiX$^2_4$, such as tetrabutyl orthotitanate is used as the organic metal compound. In the case when a mixture of one or more organic silane compounds and one or more organic metal compounds is used, the molar ratio of the organic silane compound to the organic metal compound may be from 0.001:1 to 1000:1, from 0.01:1 to 100:1, from 0.1:1 to 100:1, or from 1:1 to 100:1. Preferably, a mixture of TEOS and an organic zirconia is used. Also preferably, a mixture of TEOS and an organic titanium compound is used.

The hydroxy-functional sol-gel nanoparticles useful in preparing the first and second surface-modified particles may be each independently obtained by combining a catalyst and an organic silane compound having the structure of SiX$^1_4$, wherein X$^1$ is a hydrolyzable substituent; and optionally an organic metal compound having the structure of MX$^1_3$ or MX$^1_4$, or mixtures thereof; wherein X$^1$ is a hydrolyzable substituent, and M is selected from Al, Zr, Ti, or combinations thereof;

optionally a silane-functional light emitting compound having the structure of formula (III), $$D\text{-}L\text{-}SiX_3 \quad (III)$$

wherein D is the luminophore, L is a direct bond or an organic group, and X is a hydrolyzable substituent; and optionally a solvent.

The organic silane compound having the structure of SiX$^1_4$, the silane-functional light emitting compound, and the organic metal compound useful in preparing the hydroxy-functional sol-gel nanoparticles may include those described above in step (ii) of preparing the first and second surface-modified particles. In the case when a mixture of one or more organic silane compounds and one or more organic metal compounds is used, the molar ratio of the organic silane compound to the organic metal compound may be from 0.001:1 to 1000:1, from 0.01:1 to 100:1, from 0.1:1 to 100:1, or from 1:1 to 100:1. Preferably, a mixture of TEOS and an organic zirconia is used. Also preferably, a mixture of TEOS and an organic titanium compound is used. The molar ratio of the silane-functional light emitting compound (D-L-SiX$_3$) to the combined amount of the organic silane compound and the organic metal compound may be from 0.0001:1 to 0.2:1, from 0.0002:1 to 0.05:1, or from 0.0005:1 to 0.01:1.

Preparation of the hydroxy-functional sol-gel nanoparticles useful in the present invention is generally conducted by known sol-gel chemistry, e.g., by hydrolysis of the organic silane compound and/or the organic metal compound. The organic silane compound and optionally the organic metal compound undergo hydrolysis and co-condense with the silane-functional light emitting compound, if present, to form the hydroxy-functional sol-gel nanoparticles in the presence of the catalyst. Examples of suitable catalysts include HCl, $H_2SO_4$, $CH_3COOH$, HF or $NH_4OH$. The reaction for forming the hydroxy-functional sol-gel nanoparticles can be carried out in the presence of a solvent. Preferred solvents are organic solvents. Examples of suitable solvents include alcohols such as ethanol, methanol, 1-propanol, 2-propanol, 1-methoxy-2-propanol, or mixtures thereof. In one embodiment, ethanol is used as the solvent. The concentration of the reactants may be in a range of, based on the volume of the solvent, from 0.05 to 1 mol/L, from 0.1 to 0.8 mol/L, or from 0.1 to 0.5 mol/L. The time duration for such reaction may be in the range of from 1 hour to 48 hours, from 1 hour to 24 hours, or from 2 hours to 12 hours. The reaction may be conducted at a temperature in the range of 20° C. to 100° C., 40° C. to 70° C., or 50° C. to 60° C.

The hydroxy-functional sol-gel nanoparticles, the silane-functional light emitting compound, and optionally the organic silane compound and/or the organic metal compound described above can react to form the first and second surface-modified particles. Such reaction can be conducted in a sol gel process, for example, a similar manner as described above in preparing the hydroxy-functional sol-gel nanoparticles. The molar ratio of the silane-functional light emitting compound to the organic silane compound used to make the hydroxy-functional sol-gel nanoparticles may be from 0.0001:1 to 0.2:1, from 0.002:1 to 0.05:1, or from 0.005:1 to 0.01:1.

In one embodiment, after the reaction, at least 5%, at least 10%, at least 15%, or even at least 20%, of the hydroxyl group on the surface of the hydroxy-functional sol-gel nanoparticles reacts with the silane-functional light emitting compound to form the at least one covalent bond described above through a sol gel process.

The green color conversion layer in the color conversion array may further comprise a polymeric binder. Examples of suitable polymeric binders are selected from polystyrene, silicone resin, acrylic resin, epoxy resin, or mixtures thereof. It is preferred that the polymer binder is transparent, or at least semi-transparent. In one embodiment, the binder is a photoresist resin comprising a binder resin, a cross-linker, a photo-polymerization initiator, a solvent and additives. The widely used binder resins include a homopolymer or a copolymer of acrylic acid, acrylic ester, acrylic amide, maleic acid, acrylo nitrile, styrene, vinyl acetate, vinylidene chloride and maleimide. Among this, the copolymer including acrylic acid and acrylic ester of a carboxylic group is most preferable. The photo-polymerization initiator may include, for example, ester groups such as 2-hydroxyethyl-acrylate, ethylglycoldiacrylate, pentaerythritol diacrylate, glycerolacrylate, oxime ester and bisphenol epoxy diacrylate. The solvent may be selected from esters such as ethyl acetate and butyl acetate, ketones such as cyclohexanone and ethyl butyl ketone, alcohol derivatives such as ethylene glycol monoethyl ether acetate and propylene glycol methyl ether acetate, and nitrogen contained groups such as dimethylformamide. These organic solvents may be employed independently or in combination of at least two elements. Finally, the additives such as thermal polymerization inhibitors, plasticizers, auxiliary stabilizers, surface protectors, leveling agents coating agents, or mixtures thereof may be additionally employed in the photoresist resin. In the case when the green color conversion layer comprises the first surface-modified particles, the first surface-modified particles may be embedded in a film formed by one or more polymeric binders described above. The content of the first surface-modified particles in the polymeric binder may be from 0.001% to 80% by weight, from 0.01% to 60% by weight, from 0.1% to 30% by weight, or from 1% to 30% by weight of the total solids weight of the first surface-modified particles plus the polymeric binder. In one embodiment, in addition to the first surface-modified particles, the green color conversion layer may further comprise other types of green emitting materials such as the organic light emitting compounds as described above that emit green light, inorganic phosphors, or quantum dots.

The red color conversion layer in the color conversion array may further comprise a polymeric binder including those as described in the green color conversion layer. In the case when the red color conversion layer comprises the second surface-modified particles, the content of the second surface-modified particles in the red color conversion layer may be substantially the same as that of the first surface-modified particles in the green color conversion layer described above. In one embodiment, in addition to the second surface-modified particles, the red color conversion layer may further comprise other types of red emitting materials such as the organic light emitting compounds as described above that emit red light, inorganic phosphors, or quantum dots. The red color conversion layer may be formed by the same process as described in forming the green color conversion layer.

The color conversion array useful in the present invention may further comprise one or more blue light blocking layers comprising one or more than one blue light absorption materials. The blue light blocking layer may be placed on top of the red color conversion layer and/or the green color conversion layer away from the backlight unit. The blue light absorption materials may be perylene, pyrene, coumarin, ethynylanthracene, or other suitable yellow colorants. In one embodiment, the blue light blocking material placed on top of the green color conversion layer may also block red light. In another embodiment, the blue light blocking material placed on top of the red color conversion layer may also block green light.

The color conversion layer may be prepared by gap coating, drop coating, spray coating, roll coating, ink-jetting, spin coating, or other suitable coating techniques. A pixilation process may be employed to fabricate the color conversion array. The pixilation process may be a photolithography process, wherein ultraviolet (UV) light rays are irradiated to selectively expose the red color conversion layer and the green color conversion layer in a sequential manner. The exposed layer is then developed to form a color conversion pattern. The developing process is performed using one of a dipping method, a bubble method and a shower spray method. After developing, the color conversion layer may be hardened at a high temperature condition of about 200-230° C. After the pixilation process, an acrylic resin or a polyamide resin may be utilized to deposit a planarization layer on the entire color conversion array surface, thereby forming a transparent overcoat layer.

In one embodiment, in addition to the color conversion array described above, the light emitting apparatus of the present invention further comprises a backlight unit that emits blue light. Preferably, the backlight unit is an active matrix light emitting diode. More preferably, the backlight unit is an active matrix OLED.

In another embodiment, the light emitting apparatus of the present invention may further comprise a liquid crystal component that can function as the light valve. In this case, the backlight unit may be a blue lamp. Preferably, the backlight unit is a blue LED lamp. In one embodiment, the liquid crystal component may be sandwiched between the backlight unit and the color conversion array. In another embodiment, the liquid crystal component may be placed on top of the color conversion array which overlays the backlight unit.

The light emitting apparatus of the present invention may be used in various devices including, for example, televisions, mobile phones, tablets, and automotive electronics. The present invention also relates to an electronic device comprising the light emitting apparatus. The electronic device may be an LCD display, an OLED display, or an LED display.

With reference to FIG. 1a, there is shown a schematic perspective view of one embodiment of a light emitting apparatus 10 disclosed herein comprising color conversion array 11, and backlight unit 12.

Figure 1B:
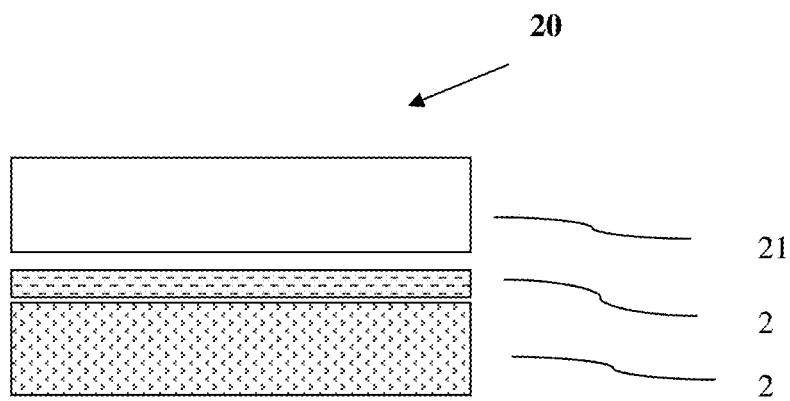

With reference to FIG. 1b, there is shown a schematic perspective view of one embodiment of a light emitting apparatus 20 disclosed herein comprising color conversion array 21, backlight unit 22, and liquid crystal component 23 sandwiched therebetween.

Figure 1C:
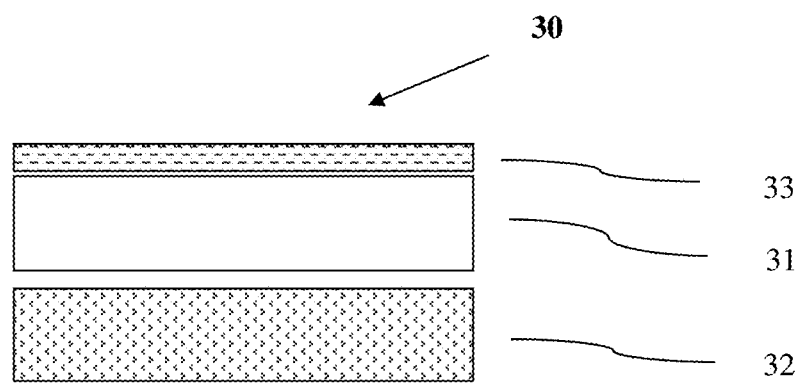

With reference to FIG. 1c, there is shown a schematic perspective view of one embodiment of a light emitting apparatus 30 disclosed herein comprising color conversion array 31, backlight unit 32, and liquid crystal component 33, so that color conversion array 31 resides between backlight unit 32 and liquid crystal component 33.

Figure 2A:
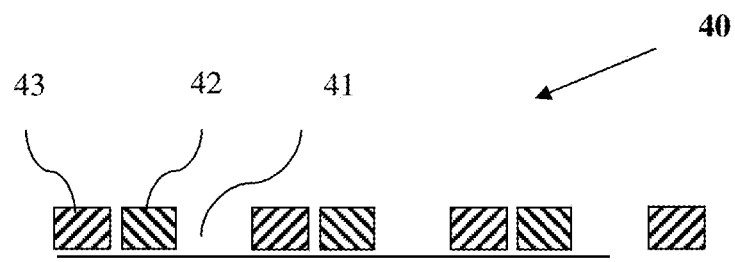
FIG. 2a, FIG. 2b, and FIG. 2c are each a cross-section of a color conversion array in one embodiment of a light emitting apparatus of the present invention.

With reference to FIG. 2a, there is shown a cross section of one embodiment of color conversion array 40 in a light emitting apparatus of the present invention. Color conversion array 40 comprises, blue pixel area 41, green color conversion layer 42 comprising the first surface-modified particles, and red color conversion layer 43 comprising the second surface-modified particles.

Figure 2B:
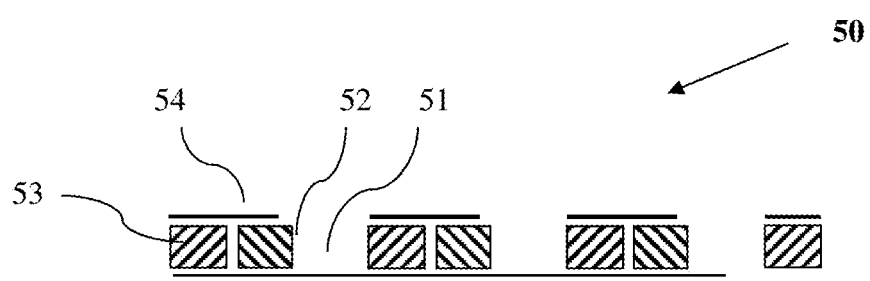

With reference to FIG. 2b, there is shown a cross section of one embodiment of color conversion array 50 in a light emitting apparatus of the present invention. Color conversion array 50 comprises, blue pixel area 51, green color conversion layer 52 comprising the first surface-modified particles, and red color conversion layer 53 comprising the second surface-modified particles. Color conversion array 50 further comprises blue light blocking layer 54 on top of green color conversion layer 52 and red color conversion layer 53.

Figure 2C:
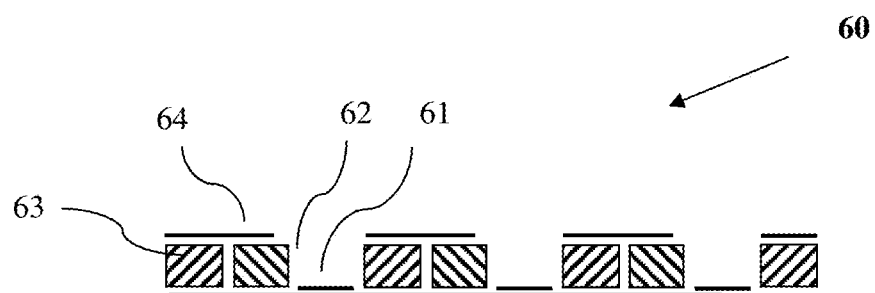

With reference to FIG. 2c, there is shown a schematic perspective view of one embodiment of color conversion array 60 in a light emitting apparatus of the present invention. Color conversion array 60 comprises, blue pixel area 61, green color conversion layer 62 comprising the first surface-modified particles, and red color conversion layer 63 comprising the second surface-modified particles. Color conversion array 60 further comprises light blocking layer 64 on top of blue pixel area 61, green color conversion layer 62, and red color conversion layer 63.

EXAMPLES

Some embodiments of the invention will now be described in the following Examples, wherein all parts and percentages are by weight unless otherwise specified.

The following materials are used in the examples:

All solvents and reagents were obtained from commercial vendors, and were used in the highest available purities or analytical grade unless otherwise specified.

Tetraethyl orthosilicate ("TEOS"), methyltriethoxysilane ("MTES"), triethoxylsilane, 2-allyl-phenol, $POCl_3$, phenol, and allyl bromide (CAS No. 106-95-6) are all available from Sigma Aldrich.

Anhydrous ethanol, 2-Propanol, ammonia (25-28 wt %), 2,3-dicyano-5,6-dichlorobenzoquinone ("DDQ"), N-methyl-pyrrolidone ("NMP"), petroleum ether, $NH_4Cl$, $NaHCO_3$, $Na_2SO_4$, $K_2CO_3$, tetrahydrofuran ("THF"), ethyl acetate ("EA"), and methanol are all available from Sinopharm Chemical Reagent Co., Ltd.

Propylene glycol monomethyl ether acetate ("PGMEA") and N, N'-Bis (2, 6-diisopropylphenyl)-1, 6, 7, 12-tetraphenoxy-3, 4, 9, 10-perylenetetracarboxylic Diimide (CAS No. 123174-58-3) are both available from TCI Chemicals.

Karstedt's catalyst, available from J&K Scientific Ltd., is platinum divinyltetramethy-siloxane complex in xylene (3 wt %).

PLEXIGLAS 6N polymethyl methacrylate ("PMMA"), available from Evonik Degussa, is used as a binder.

Sample A, available from Showa Denko, is an acrylic binder (30% in PGMEA).

1-[9-Ethyl-6-(2-methylbenzoyl)-9H-carbazol-3-yl]-ethanone-1-(O-acetyloxime) ("OXE-02", CAS No. 478556-66-0) is available from BASF and used as a photo initiator.

Example 1 Synthesis of Surface-Modified Particles 1A (1) Synthesis of silane-functional light emitting compound 1

Schematics of synthesis of the silane-functional light emitting compound 1 are shown as follows,

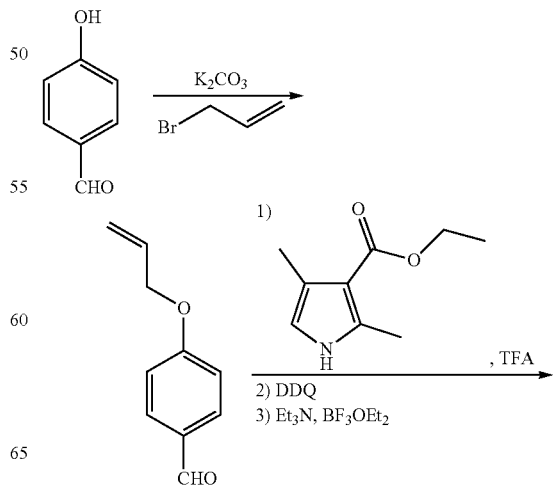

-continued

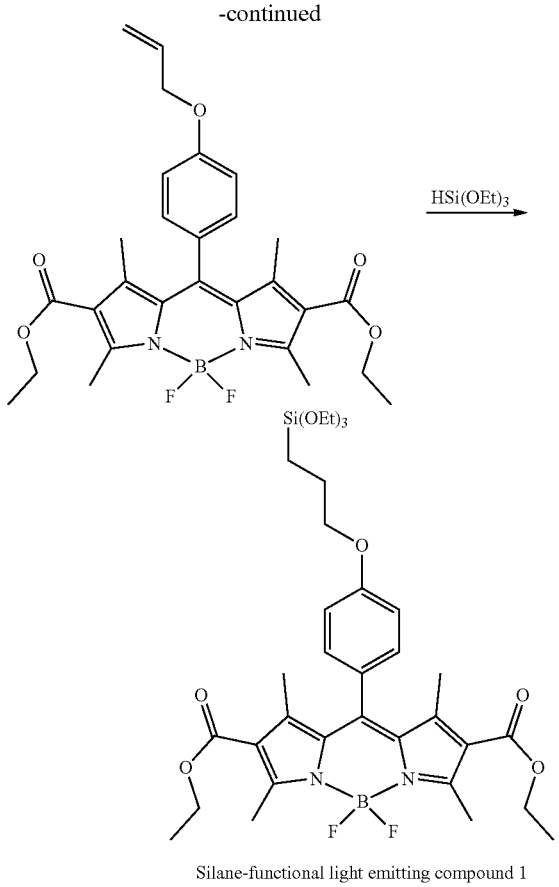

Silane-functional light emitting compound 1

To a solution of 4-hydroxybenzaldehyde (4.0 grams (g), 32.7 mmol, 1.0 equivalent (equiv.)) in acetone (40 mL), K₂CO₃ (13.6 g, 3.0 equiv.) and allyl bromide (4.3 mL, 1.5 equiv.) were added. The reaction mixture was stirred at room temperature for 2 hours and further heated to reflux overnight. After cooling to room temperature, the solution was filtered, washed with acetone and concentrated in vacuo, which afford 4-(allyloxy)benzaldehyde.

A few drops of trifluoroacetic acid were added to a 200 mL dichloromethane solution of ethyl 2,4-dimethyl-1H-pyrrole-3-carboxylate (2.1 g, 2.0 equiv.) and aldehyde (1.0 g, 1.0 equiv.). The dark reaction mixture was stirred at room temperature until the consumption of aldehyde which was tracked by thin layer chromatography. The oxidizing agent (DDQ, 1.4 g), then 30 minutes later 13.0 mL Et₃N and finally 15.0 mL trifluoroborate etherate were successively added. The mixture was filtered through a pad of silica or used crude. The filtrate was concentrated and the residue was purified by chromatography on silica or alumina gel or by automatic chromatography to afford an allyl functionalized boron-dipyrromethene (BODIPY) derivative (yield, 75%).

100 miligrams (mg) of the above synthesized allyl functionalized BODIPY derivative (0.2 mmol) was dissolved into toluene. Under nitrogen (N₂), HSi(OEt)₃ (125 mg, 4.0 equiv.) was injected through a syringe, followed by the addition of a drop of Karstedt's catalyst. The resulting mixture was stirred at 60° C. overnight. The solution was evaporated under reduced pressure. The crude product of the silane-functional light emitting compound 1 was obtained without further purification.

(2) Synthesis of surface-modified particles 1A 100 mL ethanol was added to 250 mL three-neck flask, followed by 5 mL ammonia. The mixture was slowly stirred while heated to 50° C. 3 mL TEOS was added into the reaction flask. The resulting mixture was stirred for 3 hours at 50° C. 2 mL TEOS dissolved in 18 mL ethanol was then dropped into the reaction flask in 180 minutes by peristaltic pump, and kept stirring at 50° C. overnight. 17 mg of the silane-functional light emitting compound 1 dissolved in 30 mL ethanol was added into the reaction flask and kept stirring at 50° C. for 4-5 hours. The obtained colloidal suspension was collected via centrifuge and washed with ethanol three times, and then dried in a vacuum oven at 50° C. to give solid power of surface-modified particles 1A of Example 1. The STEM image of the obtained surface-modified particles 1A is shown in FIG. 3.

Example 2 Synthesis of Surface-Modified Particles 1B 70 mL ethanol was added to 250 mL three-neck flask, followed by 5 mL ammonia. The mixture was slowly stirred and bubbled with N₂ while heated to 50° C. 80 mg of the silane-functional light emitting compound 1 (same emitter as Example 1) dissolved in 40 mL ethanol to obtain an emitter-ethanol solution. 10 mL of the emitter-ethanol solution together with 1.5 mL TEOS were added into the reaction flask. The resulting mixture was stirred for 1.5 hours at 50° C. Then 2.5 mL TEOS and the remaining 30 ml of the emitter-ethanol solution were mixed together and then dropped into the reaction flask over a period of 2.5 hours by peristaltic pump, and kept stirring at 50° C. 1 mL TEOS was mixed with 10 ml ethanol and dropped it into the reaction flask, and kept stirring at 50° C. for 2 hours. 2.7 mL MTES was added into the reaction flask and the reaction was kept for another 2-3 hours. The obtained colloidal suspension was collected via centrifuge and washed with ethanol three times, and then dried in a vacuum oven at 50° C. to give solid power of surface-modified particles 1B of Example 2. The STEM image of the obtained surface-modified particles 1B is given in FIG. 4. Thermal stability of the obtained surface-modified particles 1B was evaluated as follows, The surface-modified particles 1B were put into a convection oven at 230° C. for 1 hour, and then taken out for photoluminescent test. The emission peak intensity of photoluminescence spectrum of the sample was characterized with spectrofluorometer (HORIBA FluoroMax-4). The results showed that 95% of the initial emission peak intensity of the surface-modified particles 1B was maintained after baking at 230° C. for 1 hour.

Example 3 Synthesis of Surface-Modified Particles 2

(1) Synthesis of silane-functional light emitting compound 2

Schematics of synthesis of the silane-functional light emitting compound 2 are shown as follows,

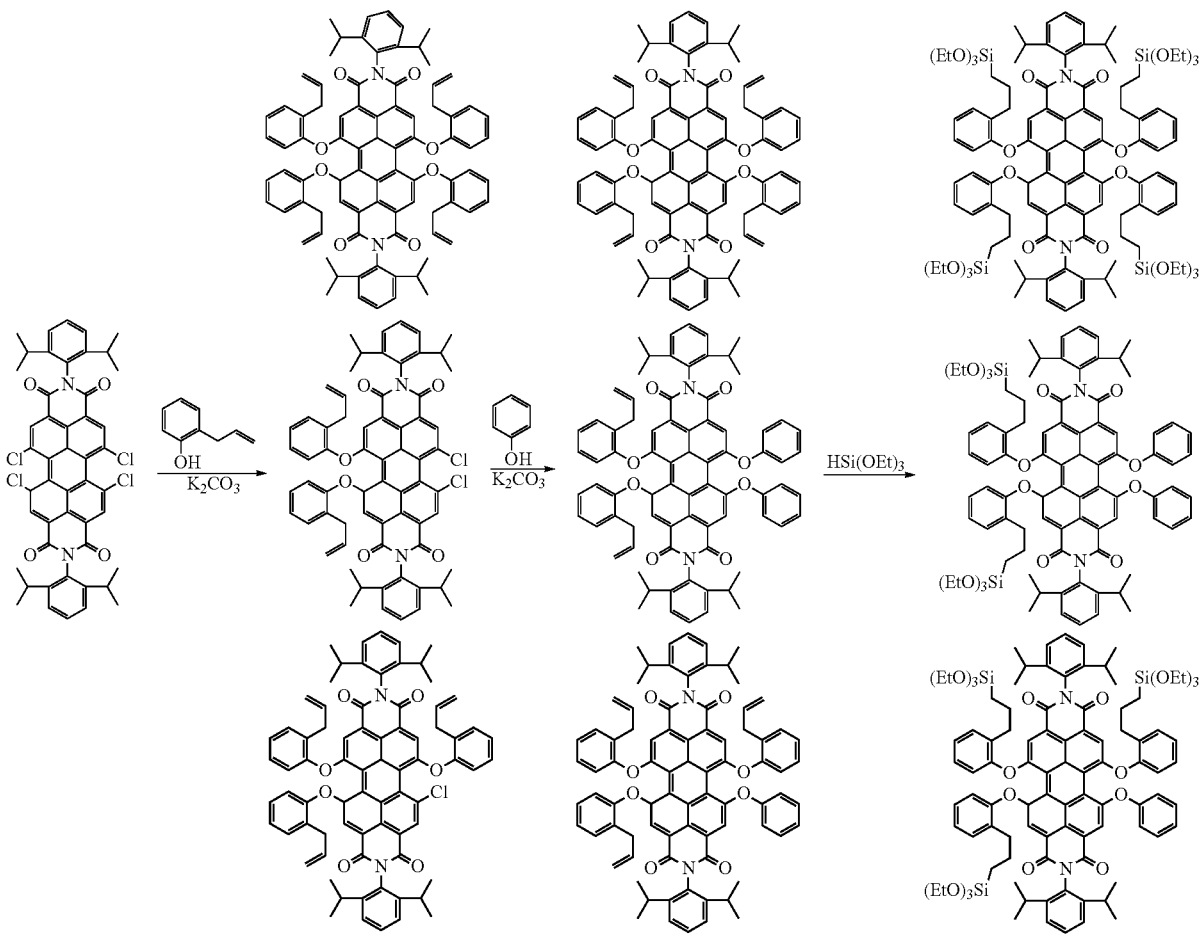

Silane-functional light emitting compound 2

N,N'-Bis(2,6-diisopropylphenyl)-1,6,7,12-tetrachloroperylene-3,4:9,10-tetracarboxylic acid diimide (1.50 g, 1.76 mmol) was treated with 2-allyl-phenol (1.42 g, 10.58 mmol) and K$_2$CO$_3$ (1.46 g, 10.58 mmol) in N-methyl-pyrrolidone (50 mL). The reaction mixture was heated at 80° C. under N$_2$ for 16 hours, then allowed to cool to room temperature, and diluent hydrochloric acid (100 mL) was added. A precipitate was formed and filtered off, washed with water to neutral pH, and dried under vacuum. The crude product was then purified by column chromatography on silica gel with a dichloromethane/petroleum ether (1:1) solvent mixture. The pure purple solid was obtained after drying (1.15 g, 53% yield).

0.5 g of the above obtained product was dissolved into 30 mL NMP, and then 4.0 equiv. excessive amount of phenol and K$_2$CO$_3$ were added. The mixture was stirred at 100° C. over 24 hours. Then, a diluent (HCl aqueous solution) was added. A precipitate was formed and was filtered off, washed with water, then hot water to neutral pH, and dried under vacuum. The crude product was then purified by column chromatography on silica gel with a dichloromethane/petroleum ether (1:1) solvent mixture. The obtained allyl functionalized products were used for further hydrosilylation with triethoxylsilane.

60 mg of the as-prepared allyl functionalized products (0.05 mmol) was dissolved into 5 mL THF. Under N$_2$, HSi(OEt)$_3$ (0.1 mL, 10.0 equiv.) was injected through a syringe, followed by the addition of a drop of Karstedt's catalyst (platinum divinyltetramethy-siloxane complex in xylene, 3 wt %). The resulting mixture was stirred at 60° C. overnight. The solution was evaporated under reduced pressure. The crude product of the silane-functional light emitting compound 2 was obtained without further purification.

(2) Synthesis of surface-modified particles 2

The synthesis of the surface-modified particles 2 was followed by the same procedure as preparing the surface-modified particles 1A of Example 1. The STEM image of the obtained second surface-modified particles 2 is given in FIG. 5.

Example 4

150 mg of the surface-modified particles 1B from Example 2 above were dissolved into 1 g of PGMEA to form a clear solution. The solution was then homogeneously mixed with 3 g of PMMA solution (30 wt % in PGMEA), coated onto a polyethylene terephthalate (PET) film, and then dried in an oven at 80° C. for 2 hours to evaporate PGMEA solvent. The thickness of the dried film was around 80-100 μm. Photostability properties of the obtained film were determined according to the test method below.

A blue backlight unit of light intensity of 1450-1500 Cd/m$^2$ was used as the light source. The surface-modified particles 1B-PMMA film sample was placed in front of the blue backlight unit for continuous irradiation in open air. The peak intensity of photoluminescence spectrum was tracked over time with spectrofluorometer (HORIBA FluoroMax-4). Results of retention of initial emission peak intensity vs. irradiation time are given in Table 1.

Example 5

The surface-modified particles 2-PMMA film was prepared according to the same procedure as described above for preparing the surface-modified particles 1B-PMMA film of Example 4, except that the surface-modified particles 2 were used in Example 5. Photostability of the surface-modified particles 2-PMMA film was evaluated according to the test method described above in Example 4.

Table 1 gives photostability properties of films of Examples 4 and 5. As shown in Table 1, the surface-modified particles 1B-PMMA and the surface-modified particles 2-PMMA films showed good photostability with about 90% and 100% retention of initial light intensity after 100 hours irradiation by blue backlight, respectively.

TABLE 1

| Sample | Photostability of surface-modified particles-PMMA films under blue backlight irradiation for 100 hours, % of initial emission peak intensity |
|---|---|
| Example 4 | 90 |
| Example 5 | 100 |

Example 6

150 mg of the surface-modified particles 1A obtained from Example 1 above was dissolved into 1.2 g of PGMEA to form a clear solution. The solution was then homogeneously mixed with a photoresist acrylic binder (Sample A acrylic binder (30 wt % in PGMEA), available from Showa Denko) developed for traditional color filters and 9 mg of a photo initiator OXE-02. After thorough mixing, the mixture was coated onto a glass substrate via spin coating and then pre-baked in an oven at 100° C. for 2 minutes. The resulted film was irradiated under 365 nm UV with an intensity of 50 mJ/cm$^2$, followed by baking at 230° C. for 60 minutes. The photoluminescence spectrum of the sample was recorded before and after each step with spectrofluorometer (HORIBA FluoroMax-4). Stability of the surface-modified particles 1A under UV curing and hard-baking conditions is given in Table 2.

Table 2 shows the stability performance of the surface-modified particles 1A in the acrylic binder towards the UV curing and hard-baking conditions commonly used for forming a conventional color filter array. As shown in Table 2, the surface-modified particles 1A in the acrylic binder were stable toward the UV curing conditions. After baking at 230° C. for 60 minutes, 56% of its initial emission peak intensity was maintained.

TABLE 2

Stability of Surface-modified Particles 1A under UV curing and hard-baking conditions

| Sample | Process | Peak, nm | FWHM, nm | % of initial emission peak intensity |
|---|---|---|---|---|
| Example 6 | After pre-baking at 100° C. | 510 | 26 | 100 |
| | After 365 nm UV irradiation | 510 | 27 | 85 |
| | After 60 min baking at 230° C. | 512 | 29 | 56 |

In summary, the as prepared surface-modified particles demonstrated good color performance, and good photostability and thermal stability. They also showed promising results when applied into the process commonly used for preparing color filters. Therefore, the surface-modified particles are potential candidates for use in color conversion arrays.

What is claimed is:

1. A light emitting apparatus comprising:
   a backlight unit that emits visible blue light; and
   a color conversion array receiving the blue light from the backlight unit,
   wherein the color conversion array comprises a green color conversion layer and a red color conversion layer,
   wherein at least one of the green color conversion layer and the red color conversion layer comprises first or second surface-modified particles that emit green or red light respectively, and said first or second surface-modified particles comprise sol-gel nanoparticles and a plurality of luminophores attached to the surface of the sol-gel nanoparticles, where the luminophores have an absorption of at least 1000 $M^{-1}$ $cm^{-1}$ in a spectral region of 430-500 nm and exhibit a full width half maximum of the emission band of less than 100 nm; and
   wherein the color conversion array allows at least a portion of the blue light of the backlight unit to pass through so that at least red, green, and blue light are emitted by the light emitting apparatus to create colors comprising red, green, and blue components.

2. The light emitting apparatus of claim 1, wherein the color conversion array comprises a green color conversion layer comprising the first surface-modified particles, and a red color conversion layer comprising the second surface-modified particles; and
   wherein the color conversion array allows at least a portion of the blue light of the backlight unit to pass through so that the red, green, and blue light are emitted by the light emitting apparatus to create colors with red, green, and blue components.

3. The light emitting apparatus of claim 1, wherein the sol-gel nanoparticles are selected from silica, alumina, zirconia, titania, or mixtures thereof.

4. The light emitting apparatus of claim 1, wherein the plurality of luminophores are covalently bonded with the sol-gel nanoparticles via —Si—O—Si—, —Al—O—Si—, —Ti—O—Si—, —Zr—O—Si—, —Al—O—Al, or combinations thereof.

5. The light emitting apparatus of claim 1, wherein the first and second surface-modified particles are each independently obtained by (i) providing hydroxy-functional sol-gel nanoparticles; and
(ii) reacting the hydroxy-functional sol-gel nanoparticles from step (i) with a silane-functional light emitting compound having the structure of formula III,

D-L-SiX$_3$  (III)

wherein D is the luminophore, L is a direct bond or an organic group, and X is a hydrolyzable substituent.

6. The light emitting apparatus of claim 5, wherein at least 5% of hydroxyl groups on the surface of the hydroxy-functional sol-gel nanoparticles react with the silane-functional light emitting compound to form covalent bonds through a sol gel process.

7. The light emitting apparatus of claim 5, wherein the first and second surface-modified particles are each independently obtained by
(i) providing hydroxy-functional sol-gel nanoparticles; and
(ii) reacting the hydroxy-functional sol-gel nanoparticles from step (i) with a mixture comprising:
(a) a silane-functional light emitting compound having the structure of formula (III),

D-L-SiX$_3$  (III)

wherein D is the luminophore, L is a direct bond or an organic group, and X is a hydrolyzable substituent; and
(b) an organic silane compound having the structure of SiX$^1_4$, wherein X$^1$ is a hydrolyzable substituent.

8. The light emitting apparatus of claim 5, wherein the hydroxy-functional sol-gel nanoparticles are obtained by combining
an organic silane compound having the structure of SiX$^1_4$, wherein X$^1$ is a hydrolyzable substituent;
a catalyst;
optionally an organic metal compound having the structure of MX$^1_3$ or MX$^1_4$, or mixtures thereof; wherein X$^1$ is a hydrolyzable substituent, and M is selected from Al, Zr, Ti, or combinations thereof;
optionally a silane-functional light emitting compound having the structure of formula (III),

D-L-SiX$_3$  (III)

wherein D is the luminophore, L is a direct bond or an organic group, and X is a hydrolyzable substituent; and
optionally a solvent.

9. The light emitting apparatus of claim 1, wherein the luminophores in the first surface-modified particles derive from organic emitting compounds having the structure of formula (I):

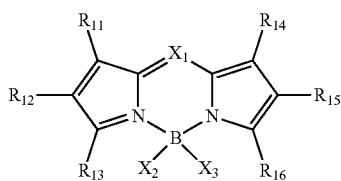

(I)

wherein R$_{11}$ through R$_{16}$ are each independently selected from the group consisting of H, a halogen, —CN, —CF$_3$, —NO$_2$, a substituted or unsubstituted C$_1$-C$_{24}$ alkyl, a substituted or unsubstituted C$_2$-C$_{24}$ alkenyl, a substituted or unsubstituted C$_2$-C$_{24}$ alkynyl, a substituted or unsubstituted C$_1$-C$_{24}$ alkoxy, a substituted or unsubstituted C$_3$-C$_{20}$ cyclic or heterocyclic group, —SO$_3$H, sulfonate, —SO$_2$O—, a thio ether, an ether, a urea, —CO$_2$H, an ester, an amide, an amine, a C$_6$-C$_{20}$ substituted or unsubstituted aromatic group, and a C$_5$-C$_{20}$ substituted or unsubstituted heteroaromatic group; R$_{11}$ and R$_{12}$ may join together to form a 5-, 6-, 7-membered ring together with the atoms they are bonded; R$_{12}$ and R$_{13}$ may join together to form a 5-, 6-, 7-membered ring together with the atoms they are bonded; R$_{14}$ and R$_{15}$ may join together to form a 5-, 6-, 7-membered ring together with the atoms they are bonded; and R$_{15}$ and R$_{16}$ may join together to form a 5-, 6-, 7-membered ring together with the atoms they are bonded;

wherein X$_1$ is N or CR$_{17}$, wherein R$_{17}$ is selected from the group consisting of H, a halogen, —CN, —CF$_3$, a substituted or unsubstituted C$_1$-C$_{24}$ alkyl, a substituted or unsubstituted C$_2$-C$_{24}$ alkenyl, a substituted or unsubstituted C$_2$-C$_{24}$ alkynyl, a substituted or unsubstituted C$_1$-C$_{24}$ alkoxy, a substituted or unsubstituted C$_3$-C$_{20}$ cyclic or heterocyclic group, a substituted or unsubstituted C$_6$-C$_{20}$ aromatic group, a substituted or unsubstituted C$_5$-C$_{20}$ heteroaromatic group, an ether, an ester, a carboxylic acid, —OH, an amide, an amine, and a sulfide; and wherein X$_2$ and X$_3$ are each independently selected from the group consisting of a halogen, a substituted or unsubstituted C$_1$-C$_{24}$ alkyl, a substituted or unsubstituted C$_2$-C$_{24}$ alkenyl, a substituted or unsubstituted C$_2$-C$_{24}$ alkyne, a substituted or unsubstituted C$_3$-C$_{20}$ cyclic or heterocyclic group, a C$_6$-C$_{20}$ substituted or unsubstituted aromatic group, a substituted or unsubstituted C$_5$-C$_{20}$ heteroaromatic group, and a substituted or unsubstituted C$_1$-C$_{24}$ alkoxy; and X$_2$ and X$_3$ may join together to form a single substituent group.

10. The light emitting apparatus of claim 1, wherein the luminophores in the second surface-modified particles derive from organic light emitting compounds selected from perylenediimide, boron-dipyrromethene, diketopyrrolopyrrol, 4-dicyanomethylene-2-t-butyl-6-1,1,7,7-tetramethyl-julolidyl-9-enyl-4H-pyran, coumarin, rhodamine, fluorescein, and cyanine.

11. The light emitting apparatus of claim 1, wherein the sol-gel nanoparticles in the first or second surface-modified particles independently have a particle size in the range of from 10 nm to 2,000 nm.

12. The light emitting apparatus of claim 1, wherein the wavelength of the blue light from the backlight unit is from 430 nm to 500 nm.

13. The light emitting apparatus of claim 1, wherein the color conversion array further comprises one or more blue light blocking layers comprising one or more than one blue light absorption materials, placed on top of the red color conversion layer and/or the green color conversion layer away from the backlight unit.

14. The light emitting apparatus of claim 1, wherein the red color conversion layer further comprises organic red light emitting compounds, inorganic phosphors, quantum dots, or mixtures thereof.

15. The light emitting apparatus of claim 1, wherein the green color conversion layer further comprises organic green light emitting compounds, inorganic phosphors, quantum dots, or mixtures thereof.

16. An electronic device comprising a light emitting apparatus of claim 1.

17. The electronic device of claim 16, wherein the electronic device is an LCD display, an LED display, or an OLED display.

18. A light emitting apparatus comprising:
a backlight unit that emits visible blue light; and
a color conversion array receiving the blue light from the backlight unit,
wherein the color conversion array comprises a green color conversion layer and a red color conversion layer;
wherein at least one of the green color conversion layer and the red color conversion layer comprises first or second surface-modified particles that emit green or red light respectively, and said first or second surface-modified particles comprise sol-gel nanoparticles and a plurality of luminophores attached to the surface of the sol-gel nanoparticles, where the luminophores have an absorption of at least 1000 $M^{-1}$ $cm^{-1}$ in a spectral region of 430-500 nm and exhibit a full width half maximum of the emission band of less than 100 nm;
wherein the color conversion array allows at least a portion of the blue light of the backlight unit to pass through so that at least red, green, and blue light are emitted by the light emitting apparatus to create colors comprising red, green, and blue components; and
wherein the luminophores in the first surface-modified particles derive from organic light emitting compounds having the structure of formula (II):

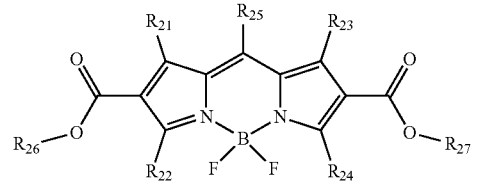

wherein $R_{21}$ through $R_{25}$ are each independently selected from the group consisting of H, a halogen, —CN, —$CF_3$, —$NO_2$, a substituted or unsubstituted $C_1$-$C_{24}$ alkyl, a substituted or unsubstituted $C_2$-$C_{24}$ alkenyl, a substituted or unsubstituted $C_2$-$C_{24}$ alkynyl, a substituted or unsubstituted $C_1$-$C_{24}$ alkoxy, a substituted or unsubstituted $C_3$-$C_{20}$ cyclic or heterocyclic group, —$SO_3H$, sulfonate, —$SO_2O$—, a thio ether, an ether, a urea, —$CO_2H$, an ester, an amide, an amine, a substituted or unsubstituted $C_6$-$C_{20}$ aromatic group, and a substituted or unsubstituted $C_5$-$C_{20}$ heteroaromatic group; and $R_{26}$ and $R_{27}$ are each independently selected from the group consisting of a substituted or unsubstituted $C_1$-$C_{20}$ alkyl, a substituted or unsubstituted $C_2$-$C_{20}$ alkenyl, a substituted or unsubstituted $C_2$-$C_{24}$ alkynyl, a substituted or unsubstituted $C_1$-$C_2$ alkoxy, a substituted or unsubstituted $C_6$-$C_{24}$ aryl group; a substituted or unsubstituted $C_3$-$C_{20}$ cyclic or heterocyclic group, and a substituted or unsubstituted $C_5$-$C_{20}$ heteroaromatic group.

* * * * *